United States Patent
Van Bommel et al.

(10) Patent No.: US 9,722,152 B2
(45) Date of Patent: Aug. 1, 2017

(54) LIGHT EMITTING DEVICE COMPRISING RELEASABLE WAVELENGTH CONVERTER

(71) Applicant: PHILIPS LIGHTING HOLDING B.V., Eindhoven (NL)

(72) Inventors: Ties Van Bommel, Eindhoven (NL); Rifat Ata Mustafa Hikmet, Eindhoven (NL); Dominique Maria Bruls, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/103,354

(22) PCT Filed: Dec. 22, 2014

(86) PCT No.: PCT/EP2014/078939
§ 371 (c)(1),
(2) Date: Jun. 10, 2016

(87) PCT Pub. No.: WO2015/101535
PCT Pub. Date: Jul. 9, 2015

(65) Prior Publication Data
US 2016/0315232 A1    Oct. 27, 2016

(30) Foreign Application Priority Data
Jan. 2, 2014    (EP) .................................... 14150006

(51) Int. Cl.
*H01L 33/50* (2010.01)
*H01L 33/48* (2010.01)
(Continued)

(52) U.S. Cl.
CPC .............. *H01L 33/507* (2013.01); *F21V 7/00* (2013.01); *F21V 9/08* (2013.01); *F21V 29/70* (2015.01);
(Continued)

(58) Field of Classification Search
CPC ..... H01L 33/507; H01L 33/483; H01L 33/58; H01L 33/644; F21V 29/70; F21V 7/00;
(Continued)

(56) References Cited

U.S. PATENT DOCUMENTS 7,982,229 B2 *   7/2011   Bechtel ................ G02B 6/0068
                                                                  257/98
8,783,887 B2 *   7/2014   Caruso ...................... F21V 9/10
                                                                  313/467
(Continued)

FOREIGN PATENT DOCUMENTS

EP        1995780 A1    11/2008
EP        2555261 A1    2/2013
(Continued)

*Primary Examiner* — Dylan White

(57) ABSTRACT

This disclosure provides a lighting device which comprises a support structure comprising a locking mechanism, a light source arranged in contact with the support structure, a wavelength converter configured to convert light from a first wavelength range to a second wavelength range, the wavelength converter having a light entrance surface configured to receive light and a light exit surface configured to emit light. The wavelength converter is releasably connected to the support structure in a locked position via said locking mechanism, and the light entrance surface is arranged in optical contact with the light source.

15 Claims, 3 Drawing Sheets

(51) Int. Cl.
*H01L 33/58* (2010.01)
*H01L 33/64* (2010.01)
*F21V 7/00* (2006.01)
*F21V 9/08* (2006.01)
*H05B 33/08* (2006.01)
*H05B 37/02* (2006.01)
*F21V 29/70* (2015.01)
*F21Y 115/10* (2016.01)

(52) U.S. Cl.
CPC ............ *H01L 33/483* (2013.01); *H01L 33/58* (2013.01); *H01L 33/644* (2013.01); *H05B 33/0851* (2013.01); *H05B 33/0866* (2013.01); *H05B 37/0227* (2013.01); *F21Y 2115/10* (2016.08)

(58) Field of Classification Search
CPC ... F21V 9/08; H05B 33/0857; H05B 33/0866; H05B 37/0227
USPC .......................................................... 315/151
See application file for complete search history.

(56) References Cited

U.S. PATENT DOCUMENTS

| | | | |
|---|---|---|---|
| 2008/0094829 A1 | 4/2008 | Narendran et al. | |
| 2009/0086475 A1* | 4/2009 | Caruso | F21V 9/10 362/231 |
| 2010/0019265 A1* | 1/2010 | Sormani | H01L 33/505 257/98 |
| 2010/0301360 A1 | 12/2010 | Van De Ven et al. | |
| 2015/0167906 A1* | 6/2015 | Tomiyama | G03B 21/204 353/31 |
| 2016/0079490 A1* | 3/2016 | De Boer | H01L 25/0753 257/88 |

FOREIGN PATENT DOCUMENTS

| | | | | |
|---|---|---|---|---|
| JP | EP 2555261 A1 * | 2/2013 | ................ | F21V 3/04 |
| NL | WO 2014155227 A1 * | 10/2014 | ........... | H01L 33/505 |
| NL | WO 201510153 A1 * | 7/2015 | ............. | H01L 33/58 |

* cited by examiner

1

LIGHT EMITTING DEVICE COMPRISING RELEASABLE WAVELENGTH CONVERTER

CROSS-REFERENCE TO PRIOR APPLICATIONS

This application is the U.S. National Phase application under 35 U.S.C. §371 of International Application No. PCT/EP2014/078939, filed on Dec. 22, 2014, which claims the benefit of European Patent Application No. 14150006.6, filed on Jan. 2, 2014. These applications are hereby incorporated by reference herein.

FIELD OF THE INVENTION

The invention relates to a light emitting device. In particular, the invention relates to an improved light emitting device comprising a wavelength converter.

BACKGROUND OF THE INVENTION

The development of new and more energy efficient illumination devices is one of the important technical challenges which society faces. Common technologies which are more energy efficient than traditional lighting solutions are often based on solid state light sources such as Light Emitting Diodes (LEDs).

Most, if not all, commercially available solid state light sources having a high efficiency emit light also of undesired wavelengths e.g. UV, blue, violet etc. Further, the light emitted from solid state light sources is not focused. High intensity light sources are interesting for many applications including spot lighting, digital light projection, vehicle lighting, lamps and luminaires. For these purposes it is possible to use wavelength converters which convert light of a shorter wavelength, into light of a longer wavelength in a highly transparent luminescent material. In order to increase brightness or the intensity of the light emitted, light of a longer wavelength can then be extracted from just one surface of a wavelength converter.

However, in such applications it is important to effectively couple the light from a light source into the wavelength converter which often comprises transparent phosphor for providing wavelength conversion. Furthermore, it is desirable to maintain the generated light within the luminescent layer to avoid light loss from the points where LEDs are optically coupled to the luminescent layer. U.S. Pat. No. 7,982,229 describes a conversion structure comprising phosphor which receives light from blue LEDs, converts the light into longer wavelength light and guides it to an exit surface, where the resulting brightness can be high. However, such a lighting device does not allow a customer to customize or adapt the lighting device in any way to take into account specific desirable characteristics of the lighting device such as color, shape or aspect ratio. Further, new developments may provide more efficient wavelength converters which should desirably be used in such lighting devices. US2009/0086475A1 discloses a color tunable light emitting device in which a phosphor component, which has a varying thickness, can be moved relative to a light source. EP2555261A1 discloses a phosphor element comprising portions with different phosphors and in which this element can be moved with respect to a light emitting area.

SUMMARY

With regard to the above-mentioned desired properties of a light emitting device, it is a general object of the present invention to enable improved performance of a light emitting device through an improved lighting device which is customizable and adaptable and thus able to take into account further developments or allow the customer to customize the improved lighting device.

According to a first aspect of the invention, these and other objectives are achieved through a lighting device which comprises a support structure comprising a locking mechanism, a light source arranged in contact with the support structure, a wavelength converter configured to convert light from a first wavelength range to a second wavelength range, the wavelength converter having a light entrance surface configured to receive light and a light exit surface configured to emit light. The wavelength converter is releasably connected to the support structure in a locked position via the locking mechanism, and the light entrance surface is arranged in optical contact with the light source.

The purpose of the device is to provide lighting, and the light source, which is commonly a light emitting diode (LED) or other solid state light source, is the main component providing this function. The wavelength converter is configured to convert light from a first wavelength range to a second wavelength range. It should be noted that this conversion is usually from a shorter wavelength to a longer wavelength. Furthermore, the wavelength converter is typically provided in the form of a luminescent structure comprising phosphor.

The support structure should be understood as a structure which is configured to releasably connect the wavelength converter to the support structure comprising the light source in a locked position via said locking mechanism, by which it should be understood that the wavelength converter is an exchangeable wavelength converter which may be exchanged for another exchangeable wavelength converter in order to customize or upgrade the lighting device. The support structure also contains the light source and the wavelength converter is arranged such that the light entrance surface of the wavelength converter, which is configured to receive light, receives the light from the light source. In an embodiment a light exit surface of the light source is positioned in between the light entrance surface of the wavelength converter and a surface of the support structure. For example, the light source is embedded in the support structure except for the light exit surface of the light source and the light exit surface of the light source faces the light entrance surface of the wavelength converter. The light received by the wavelength converter is then converted into the second wavelength range before being emitted through the light exit surface. It is likely that a small portion of the light remains unconverted due to the process of converting light not having a likelihood of occurring for every photon entering the wavelength converter.

The present invention is based on the realization that by using a releasably connected wavelength converter, the wavelength converter may be replaced or exchanged thus allowing for a customizable color, color point through the materials used or the intensity of the light emitted from the lighting device through the shape or aspect ratio of the light exit surface. Further, research and development may provide new and more efficient wavelength converters which may then be used in a lighting device according to the present invention, thereby enabling cost saving by reusing other parts of the lighting device.

According to one embodiment of the present invention, the support structure may comprise a heat sink which is thermally coupled to the light source. By thermally coupling the light source to a heat sink, cooling of the light source is improved and the light source will produce light more efficiently for a longer period of time, or indefinitely, without failure or reduced performance due to a too high temperature.

According to another embodiment of the invention, the heat sink may be thermally coupled to the wavelength converter. By providing a thermal coupling between the wavelength converter and the heat sink, the wavelength converter will be enabled to convert light more efficiently for a longer period of time, or indefinitely, without failure or reduced performance due to a too high temperature.

According to one embodiment of the invention the wavelength converter may be separated from the heat sink by an air gap less than 100 micrometer, preferably less than 50 micrometer and most preferably less than 20 micrometer. A small air gap of less than 100 micrometers will provide a good thermal conductivity while optically decoupling the wavelength converter from the heat sink. By optical decoupling the wavelength converter from the heat sink, the interface where light may escape from the wavelength converter is an interface between the wavelength converter and air. As air has a refractive index of 1, the likelihood that light will leave the wavelength converter is reduced while at the same time advantageous cooling properties of the device are maintained.

In one embodiment of the invention, the support structure may comprise a first portion, a second portion and a locking mechanism, the first portion being movable towards the second portion into a position where the locking mechanism maintains the first portion in a fixed position in relation to the second portion such that the wavelength converter is securely held between the first and the second portion. By providing the support structure in a first portion which is movable towards the second portion into a locked position, by use of a locking mechanism, the wavelength converter may be securely held between the first and the second portion which will in essence clamp the wavelength converter. By locked position should be understood that the first portion will automatically remain in that position relative the second portion thus providing a means for holding the wavelength converter.

According to another embodiment of the invention, the lighting device may further comprise a compressible optical element arranged between and in contact with the light source and the light entrance surface, the optical element being configured to guide light from the light source into the wavelength converter. By compressible optical element should be understood that the optical element is compressible such that, when the wavelength converter is held securely, the optical element is compressed between the wavelength converter and the support structure preventing direct physical contact between the wavelength converter and support structure as such contact may be harmful to the surface of the wavelength converter. Further, by tailoring the refractive index of the optical element, a large portion of light from the light source will be coupled by the optical element into the wavelength converter thus improving the efficiency of the lighting device.

According to one embodiment of the invention, the optical element may have a refractive index less than 1.4, preferably less than 1.2. These refractive indices will enable the optical element to couple a large portion of light into the wavelength converter thus further improving the efficiency of the device. For various embodiments of the present invention the wavelength converter will typically have a refractive index of approximately 1.7, and in some embodiments as high as approximately 2.0.

According to one embodiment of the invention, the lighting device may further comprise a compressible optical element arranged between and in contact with the wavelength converter and the support structure, the compressible optical element being configured to reflect light refracting in the interface between the compressible optical element and the wavelength converter. By configuring the compressible optical element arranged between and in contact with the support structure and the wavelength converter to reflect light, a larger portion of the light from the wavelength converter will exit the wavelength converter from the light exit surface, thus improving the brightness of the light emitted by the lighting device.

According to one embodiment of the invention, the compressible optical element may be thermally conductive, preferably having a thermal conductivity above 1 W/mK. By providing a thermally conductive compressible optical element, the wavelength converter will be thermally coupled to the support structure. By thermally coupling the wavelength converter to the support structure the wavelength converter will be enabled to convert light more efficiently for a longer period of time, or indefinitely, without failure or reduced performance due to a too high temperature.

According to another embodiment of the invention the compressible optical element may be less than 100 micrometer thick, preferably less than 20 micrometer thick. A compressible optical element which is thin, such as thinner than 100 micrometer, will efficiently conduct heat from the wavelength converter to the support structure.

According to one embodiment of the invention the support structure may comprise a first portion pivotably connected to a second portion, the first portion being pivotable towards the second portion into a locked position, thereby securely holding the wavelength converter between the first and the second portion. By providing the support structure in a first portion which is pivotable into a locked position towards the second portion the wavelength converter may be securely held between the first and the second portion which will in essence clamp the wavelength converter. By locked position it should be understood that the first portion will automatically remain in that position relative the second portion thus providing the means for holding the wavelength converter.

According to another embodiment of the invention, the support structure may further comprise a protruding portion, and the wavelength converter comprises a recess corresponding to the protruding portion, such that the protruding portion may engage with the recess to securely hold the wavelength converter in a locked position. By providing a support structure comprising a protruding portion and a wavelength converter comprising a corresponding recess, the wavelength converter may be releasably connected to the support structure through the protruding portion engaging the recess when in a closed or locked position, thus securely holding the wavelength converter.

According to one embodiment of the invention, the support structure further comprises a protruding portion and the wavelength converter further comprises a thermally conductive layer partially surrounding the wavelength converter, the thermally conductive layer being in contact with the support structure when the wavelength converter is connected to the support structure, the thermally conductive layer comprising a recess corresponding to the protruding portion such that the protruding portion may engage with the recess to securely hold the wavelength converter in a locked position in relation to the support structure. By providing a support structure comprising a protruding portion and a thermally conductive layer surrounding the wavelength converter comprising a corresponding recess, the wavelength converter may be releasably connected to the support structure through the protruding portion engaging the recess when in a closed or locked position thus securely holding the wavelength converter. Further, the thermally conductive layer, which partially surrounds the wavelength converter, will transfer heat from the wavelength converter to the support structure thus enabling the wavelength converter to convert light more efficiently for a longer period of time, or indefinitely, without failure or reduced performance due to a too high temperature.

According to one embodiment of the invention, the lighting device may further comprise a light redirecting element optically connected to the light exit surface and arranged to releasably hold the wavelength converter between the light redirecting element and the support structure. The light redirecting element may for example be a collimator, a lens or any other know light redirecting element. The light redirecting element is preferably arranged so that the wavelength converter can be clamped between the light redirecting element and a portion of the support structure.

According to a second aspect of the invention, the objectives are also met through a lighting system comprising a lighting device which comprises a support structure, a light source arranged in contact with the support structure, a wavelength converter configured to convert light from a first wavelength range to a second wavelength range, the wavelength converter having a light entrance surface configured to receive light and a light exit surface configured to emit light. The wavelength converter is releasably connected to the support structure, and the light entrance surface is arranged in optical contact with the light source. The system further comprises a detector configured to detect at least one characteristic of the wavelength converter and/or at least one characteristic of the light emitted by the light exit surface of the wavelength converter, a control unit connected to the detector and the light source, the control unit being configured to control the light source based on the detected characteristic of the wavelength converter and/or said light emitted by the light exit surface of the wavelength converter.

Many features and advantages of the second aspect of the present invention are similar to the previously mentioned features and advantages of the first aspect. However, the lighting system further comprises a detector for detecting at least one characteristic of the wavelength converter and/or the light emitted by the wavelength converter and a control unit which is connected to the light source and the detector. The control unit is configured to control the light source based on the detected characteristic of either the wavelength converter or the light emitted by the wavelength converter. Therefore when the wavelength converter has been replaced by another wavelength converter the control unit is able to efficiently control the light sources to output more or less light depending on the detected characteristic or depending on the amount of light which is required to be emitted from the wavelength converter.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing an embodiment of the invention.

DETAILED DESCRIPTION OF THE DRAWINGS

In the present detailed description, embodiments of a light emitting device according to the present invention are mainly discussed with reference to a light emitting device comprising a LED light source. It should be noted that this by no means limit the scope of the invention, which is also applicable in other circumstances, for example for use with other types of light sources. Moreover the amount of LEDs shown in the enclosed drawings is only a schematic representation. In use, the number, packing fraction and other such details will be decided by each application.

The invention will now be described with reference to the enclosed drawings where first attention will be drawn to the structure, and secondly, functions of the lighting device will be described.

Figure 1:
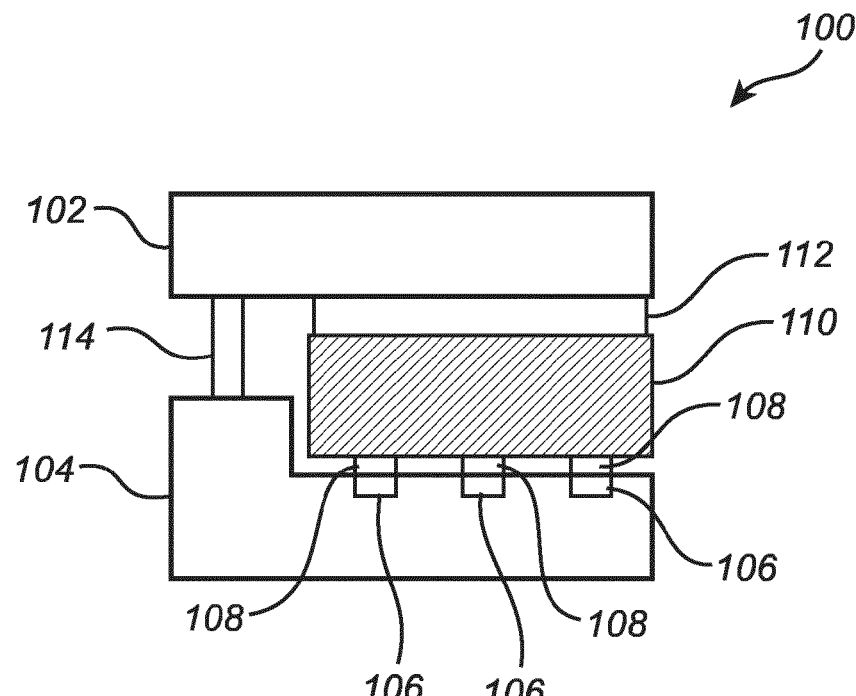
FIG. 1 is a schematic side view of a lighting device according to an embodiment of the invention.

FIG. 1 is side view of a lighting device 100 according to an embodiment of the present invention, the lighting device 100 comprises a support structure, which comprises a first 102 and a second portion 104. The lighting device further comprises a wavelength converter 110 configured to convert light from a first wavelength range to a second wavelength range. The main component providing light is herein shown as three light sources 106, the light sources 106 are typically LEDs or laser diodes and will be referred to as such henceforth, however other types of solid state light sources are also possible to use within the scope of the present invention. The LEDs 106 are arranged in contact with the support structure 104, in this case the LEDs are embedded in a surface of the support structure 104 that faces the wavelength converter 110 and such that a light emitting surfaces of the LEDs 106 face the wavelength converter 110. Arranged in contact with the LEDs 106 are compressible optical elements 108, which are arranged to guide light from the LEDs 106 to the wavelength converter 110. The surface where the light enters the wavelength converter 110 is the light entrance surface, the light entrance surface then being optical contact with the LEDs 106 through the compressible optical elements 108, and the light emitting surface of the LEDs 106 facing the light entrance surface of the wavelength convert 110 via the optical elements 108. The compressible optical elements 108 will also prevent physical contact between the support structure and the wavelength converter 110 which could be detrimental to the wavelength converter 110. Thus, in a locked position, the optical elements 108 are clamped in between the light entrance surface of the wavelength converter 110 and the light emitting surfaces of the LEDs 106. In the embodiment of the present invention shown in FIG. 1 there is also a compressible optical element 112 arranged between the wavelength converter 110 and the first portion 102 of the support structure. The compressible optical element 112 is configured to reflect light in the interface between the compressible optical element 112 and the wavelength converter 110. The compressible optical element 112 also prevents physical contact between the wavelength converter 110 and the support structure which could be harmful to the wavelength converter 110. The compressible optical elements 108, 112 will also conduct heat from the wavelength converter 110 to the support structure. The support structure 102, 104 may also comprise a heat sink (not shown) thus allowing for more heat to be transferred away from the wavelength converter 110 through the support structure. Heat is produced, in use, during the conversion process from the first wavelength range to the second wavelength range in the wavelength converter 110. Therefore, transferring heat away from the wavelength converter 110 will allow the wavelength converter 110 to convert light more efficiently for a longer period of time, or indefinitely, without failure or reduced performance due to a too high temperature. The heat sink (not shown) comprised in or being part of the support structure 102,104 may also be coupled to the LEDs 106 thus also enabling the LEDs 106 to produce light more efficiently for a longer period of time, or indefinitely, without failure or reduced performance due to a too high temperature.

The support structure further comprises a locking mechanism 114. The locking mechanism 114 enables the first portion 102 to be movable towards the second portion 104 into the position shown in FIG. 1 where the locking mechanism 114 maintains the first portion in a fixed position in relation to the second portion 104 and thereby securely holds the wavelength converter 110 between the first 102 and second portion 104 of the support structure such that the optical elements 108 are clamped in between the light entrance surface of the wavelength converter 110 and the light emitting surfaces of the LEDs 106. By increasing the distance between the first 102 and second portion 104 the locking mechanism 114 will allow the wavelength converter 110 to be removed and replaced by another wavelength converter 110 which may have different characteristics such as color, or shape or the aspect ratio of the light exit surface, thereby releasably connecting the wavelength converter 110 to the support structure. The wavelength converter is thus a replaceable, or exchangeable, wavelength converter 110. The locking mechanism 114 may be any known locking mechanism such as a snap-lock, click-lock, twist-lock, bayonet-lock or a screw-lock. The locking mechanism 114 may further comprise springs or other mechanical components for achieving the locking function.

The wavelength converter 110 preferably has a smooth (i.e. polished surface) and is a bar or rod shape (i.e. elongated) as shown in FIG. 1. The compressible optical elements 108, 112 are preferably made of a silicone material or fluoropolymer such as Polytetrafluoroethylene (PTFE) which have refractive indices which may be configured lower than 1.4 or even lower than 1.2. Furthermore, silicone materials and PTFE may conduct heat efficiently to the heat sink (not shown) comprised in the support structure 102, 104. The wavelength converter 110 is preferably comprised of either Ce doped Yttrium aluminum garnet (YAG, $Y_3AL_5O_{12}$), Lutetium-Aluminum-Garnet (LuAG), LuGaAG or LUYAG. YAG, LUAG, LuGaAG or LuYAG which converts light from a shorter wavelength to a longer wavelength. The wavelength converter can essentially be made of material selected from the group comprising $(M^I_{1-x-y}M^{II}_xM^{III}_y)3(M^{IV}_{1-z}M^V_z)_5O_{12}$— where $M^I$ is selected from the group comprising Y, Lu or mixtures thereof, $M^{II}$ is selected from the group comprising Gd, La, Yb or mixtures thereof, $M^{III}$ is selected from the group comprising Tb, Pr, Ce, Er, Nd, Eu or mixtures thereof, $M^{IV}$ is Al, $M^V$ is selected from the group comprising Ga, Sc or mixtures thereof, and $0 \leq x \leq 1$, $0 \leq y \leq 0.1$, $0 \leq z \leq 1$, $(M^I_{1-x-y}M^{II}_xM^{III}_y)_2O_3$— where $M^I$ is selected from the group comprising Y, Lu or mixtures thereof, $M^{II}$ is selected from the group comprising Gd, La, Yb or mixtures thereof, $M^{III}$ is selected from the group comprising Tb, Pr, Ce, Er, Nd, Eu, Bi, Sb or mixtures thereof, and $0 \leq x \leq 1$, $0 \leq y \leq 0.1$, $(M^I_{1-x-y}M^{II}_xM^{III}_y)S_{1-z}Se_z$— where $M^I$ is selected from the group comprising Ca, Sr, Mg, Ba or mixtures thereof, $M_{II}$ is selected from the group comprising Ce, Eu, Mn, Tb, Sm, Pr, Sb, Sn or mixtures thereof, $M^{III}$ is selected from the group comprising K, Na, Li, Rb, Zn or mixtures thereof, and $0 \leq x \leq 0.01$, $0 \leq y \leq 0.05$, $0 \leq z \leq 1$, $(M^I_{1-x-y}M^{II}_xM^{III}_y)O$— where $M^I$ is selected from the group comprising Ca, Sr, Mg, Ba or mixtures thereof, $M^{II}$ is selected from the group comprising Ce, Eu, Mn, Tb, Sm, Pr or mixtures thereof, $M^{III}$ is selected from the group comprising K, Na, Li, Rb, Zn or mixtures thereof, and $0 \leq x \leq 0.1$, $0 \leq y \leq 0.1$, $(M^I_{2-x}M^{II}_xM^{III}_2)O_7$— where $M^I$ is selected from the group comprising La, Y, Gd, Lu, Ba, Sr or mixtures thereof, $M^{II}$ is selected from the group comprising Eu, Tb, Pr, Ce, Nd, Sm, Tm or mixtures thereof, $M^{III}$ is selected from the group comprising Hf, Zr, Ti, Ta, Nb or mixtures thereof, and $0 \leq x \leq 1$, $(M^I_{1-x}M^{II}_xM^{III}_{1-y}M^{IV}_y)O_3$— where $M^I$ is selected from the group comprising Ba, Sr, Ca, La, Y, Gd, Lu or mixtures thereof, $M^{II}$ is selected from the group comprising Eu, Tb, Pr, Ce, Nd, Sm, Tm or mixtures thereof, is selected from the group comprising Hf; Zr, Ti, Ta, Nb or mixtures thereof, and $M^{IV}$ is selected from the group comprising Al, Ga, Sc, Si or mixtures thereof, and $0 \leq x \leq 0.1$, $0 \leq y \leq 0.1$, or mixtures thereof. Another wavelength converting material which is possible to use for the wavelength converter are quantum dots, which are small crystals of semiconducting material generally having a width or diameter of only a few nanometers. Such quantum dots may be incorporated in a matrix material such as a polymer (silicone, PMMA, PET) or ceramic/glass type of material. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as Indium phosphide (InP), and copper indium sulfide (CuInS2) and/or Silver Indium Sulfide (AgInS2) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Organic phosphors are also usable for the wavelength converter 110. Organic phosphors may be molecularly dissolved/dispersed in a matrix material such as a polymer (e.g. silicone, PMMA, PET). Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

In use, the LEDs 106 will emit light of a first wavelength range which will be guided through the compressible optical element 108 and into the wavelength converter 110 through the light entrance surface. A portion of the light of the first wavelength range entering the wavelength converter 110 will be converted into light of a second wavelength range, after which conversion process it will be emitted in a random direction. The portion of converted light and a portion which may be unconverted will impinge on the interface between the wavelength converter 110 and a surrounding medium. Due to the differences in the refractive indices, the light impinging on the interface between the wavelength converter 110 and the optical elements 108, 112 will have a large likelihood of total internal reflection (TIR) and thereby of being reflected back into the wavelength converter 110. Light leaving the wavelength converter may be reflected by the support structure which may comprise a reflective layer. By configuring the light exit surface of the wavelength converter 110 to emit light and the other surfaces of the wavelength converter 110 to reflect light, light will be directed towards the light exit surface of the wavelength converter 110. The light exit surface of the wavelength converter 110 has in this example an angle different from zero with respect to the light entrance surface of the wavelength converter 110, e.g. perpendicular, wherein the wavelength converter 110 in embodiments has the shape of a rod. Because the light exit surface area is smaller than the light input surface of the wavelength converter 110, an increase in brightness is achieved. When light is converted within the wavelength converter 110, energy will be dissipated and heat will be produced. The optical elements 108, 112 will advantageously, as described above, thermally couple the support structure 102, 104 comprising a heat sink (not shown) to the wavelength converter 110, and heat will be transferred through the optical elements 108,112 and hence cool the wavelength converter 110.

Figure 2:
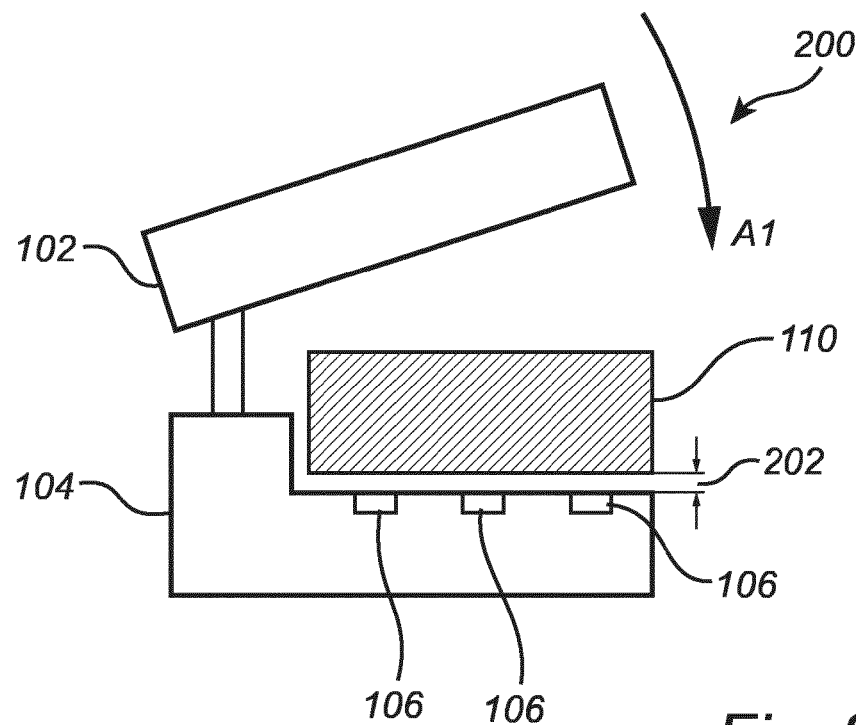
FIG. 2 is a schematic side view of a lighting device according to another embodiment of the invention.

FIG. 2 is a side view of a lighting device 200 according to another embodiment of the present invention. Compared to the embodiment shown in FIG. 1, no compressible optical elements 108, 112 are present. Thus an air gap 202 is introduced between the wavelength converter 110 and the second portion 104 of the support structure at which the LEDs 106 are provided. The air gap 202 is smaller than 100 micrometers, preferably smaller than 50 micrometers and most preferably smaller than 20 micrometer. The air gap 202 may be realized by small supports (not shown) created in the support structure 104 at a distance from the LEDs 106 such that the optical contact between the LEDs 106 and the light entrance surface is not interfered with, while still holding the wavelength converter 110 at a distance from the support structure. An air gap 202 will optically decouple the support structure 102, 104 and the wavelength converter 110 while still allowing for a large amount of heat transfer, since a thin layer of air is an efficient heat conductor. Further, it is also possible to use an air gap between the first portion 102 of the support structure and the wavelength converter 110 to conduct heat from the wavelength converter 110 to the first portion of the support structure 102. Similar to the realization between the second portion 104 of the support structure and the wavelength converter 110 small supports (not shown) may be created in the first portion 102 of the support structure to realize a distance between the support structure and the wavelength converter 110. The support structure 102, 104 also comprises a heat sink (not shown) thus enabling the support structure to absorb the heat produced, in use, by the wavelength converter 110 and the LEDs 106. The support structure 102, 104 may also function as a heat sink.

The first portion 102 of the support structure is pivotably connected to the second portion 104 of the support structure in order to enable the first portion 102 to pivot towards the second portion 104 along the direction indicated by arrow A1 into a fixed position which is maintained thus securely holding the wavelength converter 110. The first portion is held in the fixed position by a locking mechanism (not shown) which may be any known locking mechanism such as a snap-lock, or a spring or other simple mechanical components. Similar to the embodiment shown in FIG. 1, by pivoting the first portion 102 away from the second portion 104 the wavelength converter 110 is no longer securely held between the first 102 and second portion 104 thus allowing for the replacement of the, exchangeable, wavelength converter 110 with another, exchangeable, wavelength converter which may have different characteristics, thereby releasably connecting the wavelength converter 110 to the support structure in a locked position via the locking mechanism.

Figure 3:
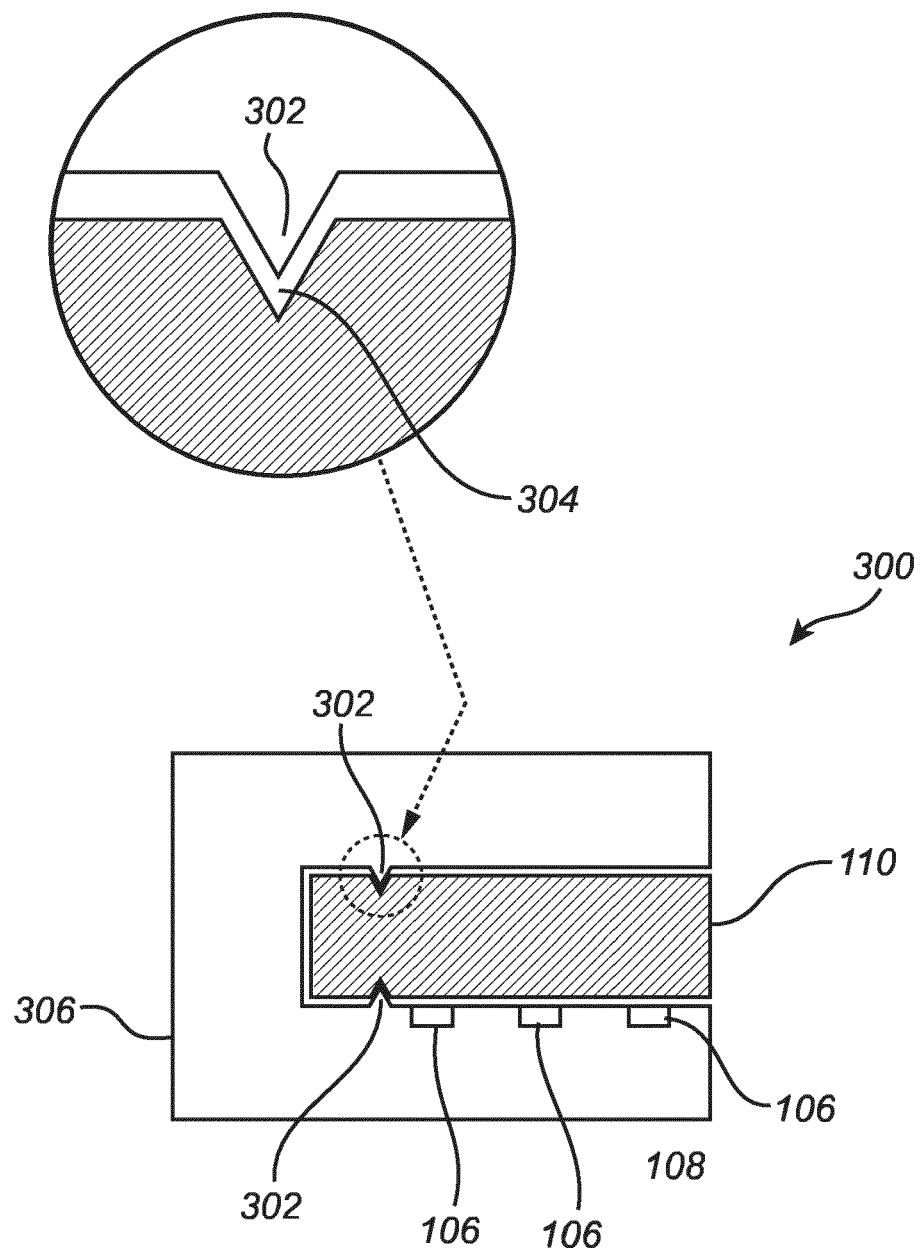
FIG. 3 is a schematic side view of a lighting device according to another embodiment of the invention.

Referring now to FIG. 3, an embodiment of the present invention where the lighting device 300 conversely to the two above described embodiments comprises a support structure 306 in one piece. There are three light sources 106 shown as three LEDs and a wavelength converter 110. The wavelength converter 110 and the support structure 306 are separated by an air gap as described above which will allow the thin layer of air to conduct heat from the wavelength converter to the support structure which comprises a heat sink (not shown). The LEDs 106 are also in thermal contact with the heat sink. In the embodiment shown in FIG. 3 the support structure further comprises two protruding portions 302, and the wavelength converter comprises two corresponding recesses 304, in combination providing for a locking mechanism. The protruding portions 302 are flexible or shaped in such a way as to allow for insertion of the wavelength converter 110. Thus, when the wavelength converter 110 is inserted into the support structure 300 towards the locked position, the protruding portion 302 will be temporarily deformed and subsequently engage the recess 304 and thereby maintain the position of the wavelength converter. A user may thus insert a wavelength converter 110 into the support structure 306, which will be locked in a fixed position by the protruding portion 302 and the recess 304 engaging each other. Similarly the wavelength converter 110 may be removed by using a small amount of force to thereby unlock the protruding portion 302 from the recess 304, thereby providing a wavelength converter 110 that is releasably connected to the support structure in a locked position via the locking mechanism formed by the protruding portion 302 and the recess 304. In applications where the support structure comprises a reflecting layer, an air gap is thus formed between the reflecting layer and the wavelength converter. The wavelength converter and support structure may also be configured such that a first portion of the wavelength converter is in contact with the support structure, while a second portion of the wavelength converter is separated from the support structure by an air gap.

Figure 4:
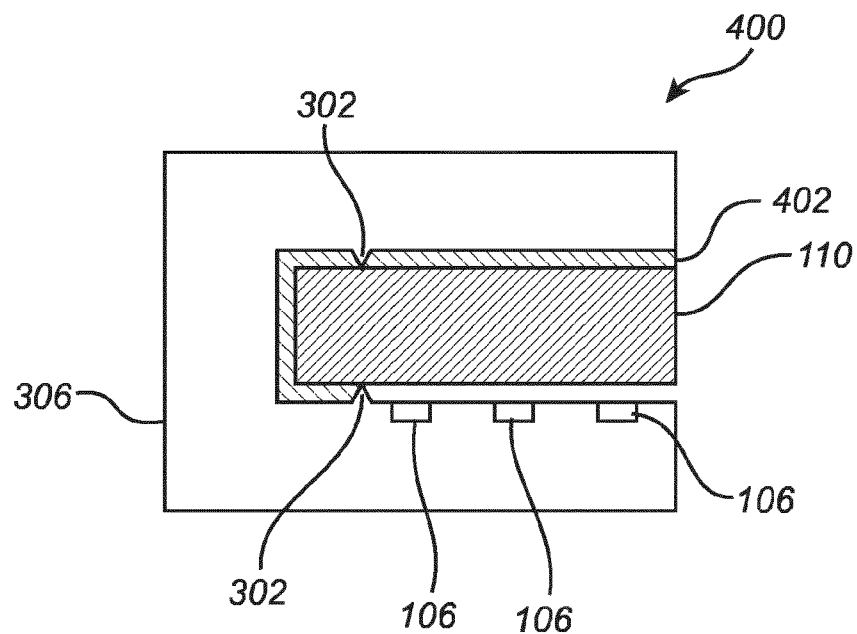
FIG. 4 is a schematic side view of a lighting device according to another embodiment of the invention.

In FIG. 4 there is shown another embodiment of the present invention comprising a mechanism for releasably connecting the wavelength converter 110 to the support structure 306 similar to the one shown in FIG. 3. In the embodiment shown in FIG. 4 the support structure 306 comprises a protruding portion 302 as in the embodiment in FIG. 3, the lighting device however further comprises a thermally conductive layer 402 which partially surrounds the wavelength converter 110, and does not cover the light entrance surface towards the light sources 106 or the light exit surface. The thermally conductive layer 402 is in contact with the support structure 306 in order to conduct heat from the wavelength converter 110 to the support structure 306 which comprises a heat sink (not shown). Compared to the embodiment shown in FIG. 3, the thermally conductive layer 402 comprises a recess corresponding to the protruding portion 302 such that the protruding portion 302 may engage with the recess to securely hold the wavelength converter 110 in a locked position in relation to the support structure 306 via a locking mechanism formed by the protruding portion 302 and the recess.

As is readily realized by the person skilled in the art, the protruding portion may equally well be arranged to protrude from the wavelength converter 110, configured to engage a corresponding recess in the support structure.

Figure 5:
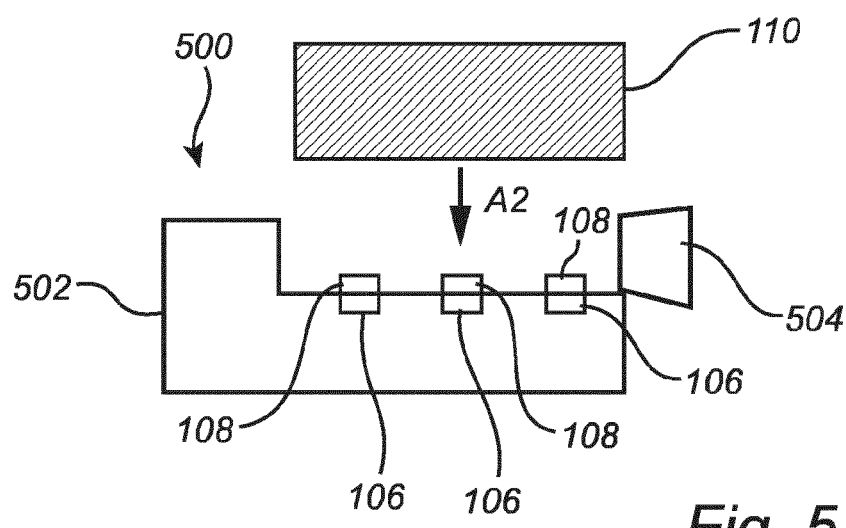
FIG. 5 is a schematic side view of a lighting device according to another embodiment of the invention.

Referring now to FIG. 5, there is shown a side view of another embodiment of the present invention comprising a mechanism for releasably connecting the wavelength converter 110. The lighting device 500 comprises a support structure 502, light sources 106, and compressible optical elements 108. The lighting device 500 further comprises a light redirecting element 504. To releasably connect the wavelength converter 110 to the support structure 502, the wavelength converter 110, in use, is clamped between a portion of the support structure 502 and the light redirecting element 502. For example, a user may insert the wavelength converter 110 along the indicating arrow A2. Accordingly, when the wavelength converter 110 is to be replaced, it is removed from the clamped position by being pulled in the opposite direction. Note that when the wavelength converter 110 is in the fixed position the light redirecting element 504 is in optical contact with the light exit surface of the wavelength converter 110. To facilitate the clamping, the distance between the portion of the support structure 502 and the light redirecting element 504 may be slightly larger than the wavelength converter 110, and a locking mechanism (not shown) may be used to keep the wavelength converter in place. Moreover, the distance between the portion of the support structure 502 and the light redirecting element 504 may be slightly smaller than the wavelength converter 110, and the portion of the support structure 502 may be slightly flexible thus allowing insertion of the wavelength converter 110. The light redirecting element 504 may for example be a collimator, a lens, a prism or any other known optical element for redirecting light.

In another embodiment, a lighting system comprises a lighting device according to any of the embodiments described above, and a detector configured to detect at least one characteristic of the wavelength converter and/or at least one characteristic of the light emitted by the light exit surface of the wavelength converter. The lighting system further comprises a control unit connected to the detector and the light source, wherein the control unit is configured to control the light source based on the detected characteristic of the wavelength converter and/or said light emitted by the light exit surface of the wavelength converter.

The detector may, for example, detect the geometrical dimensions of the wavelength converter, such as thickness, width or length. The detector may additionally, or alternatively, detect one or more characteristics of the light output, such as spectrum, color or brightness. The control unit then drives the light sources based on, for example, the detected light output and may thereby control the light sources such that a required light output, or color, or spectrum, is obtained. The detector may additionally, or alternatively, detect the temperature of the wavelength converter. The control unit may then drive the light sources based on the detected temperature and may thereby, for example, prevent overheating. The light redirecting element may also be in optical contact with the light converter e.g. the light redirecting element might be flexible (e.g. made out of silicone) or by using a compressible optical material in between the light converter and the light redirecting element.

The wavelength converter illustrated in the aforementioned embodiments may in some embodiments be larger or smaller than what is illustrated herein. The wavelength converter may fill part of the gap between the different parts of the support structure, or it may extend out of the support structure.

Even though the invention has been described with reference to specific exemplifying embodiments thereof, many different alterations, modifications and the like will become apparent for those skilled in the art. For example the light source is preferably a solid state light emitter. Examples of solid state light emitters are Light Emitting Diodes (LEDs), Organic Light Emitting diode(s) OLEDs, or, for example, laser diodes. Solid state light emitters are used since they are relatively cost effect light sources and, in general, not expensive, have a relatively large efficiency and a long life-time. The solid state light source used is preferably a UV, Violet or Blue light source due to their high efficiency. The lighting device may also comprise mirrors such that light with is not converted and reflected in the interface between the wavelength converter and surrounding material is reflected back to the wavelength converter. The lighting device may also comprise additional optical elements to redirect and or combine different light sources.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination may not be used to an advantage.

The invention claimed is:

1. A lighting device comprising:
a support structure comprising a locking mechanism,
a light source arranged in contact with said support structure,
a wavelength converter configured to convert light from a first wavelength range to a second wavelength range, said wavelength converter having a light entrance surface configured to receive light and a light exit surface configured to emit light; wherein said light exit surface of said wavelength converter has an angle different from zero with respect to said light entrance surface of said wavelength converter; wherein the light exit surface area is smaller than the light input surface area of said wavelength converter; and wherein said wavelength converter is releasably connected to said support structure in a locked position via said locking mechanism, and wherein said light entrance surface is arranged in optical contact with said light source.

2. The lighting device according to claim 1, wherein said support structure is thermally coupled to said light source.

3. The lighting device according to claim 2, wherein said support structure is thermally coupled to said wavelength converter.

4. The lighting device according to claim 3, wherein said wavelength converter is separated from the support structure by an air gap smaller than 100 micrometer, preferably smaller than 50 micrometer and most preferably smaller than 20 micrometer.

5. The lighting device according to claim 4, further comprising a compressible optical element arranged between and in contact with said wavelength converter and said support structure, said optical element being configured to reflect light refracting in the interface between said compressible optical element and said wavelength converter.

6. The lighting device according to claim 1, wherein said support structure further comprises a first portion, a second portion, wherein the first portion is movable towards said second portion into a position where said locking mechanism maintains said first portion in a fixed position in relation to said second portion such that said wavelength converter is securely held between said first and said second portion.

7. The lighting device according to claim 6, further comprising a compressible optical element arranged between and in contact with said light source and said light entrance surface of said wavelength converter, said optical element being configured to guide light from said light source to said wavelength converter.

8. The lighting device according to claim 7, wherein said compressible optical element has a refractive index lower than 1.4, preferably less than 1.2.

9. The lighting device according to claim 7, wherein said optical element is less than 100 micrometer thick, preferably less than 20 micrometer thick.

10. The lighting device according to claim 7, wherein said optical element is thermally conductive, preferably having a thermal conductivity above 1 W/mK.

11. The lighting device according to claim 1, wherein said support structure comprises a first portion pivotably connected to a second portion, said first portion being pivotable towards said second portion into a locked position, thereby securely holding said wavelength converter between said first and said second portion.

12. The lighting device according to claim 1, wherein said support structure further comprises a protruding portions, and said wavelength converter comprises a recess corresponding to the protruding portion, such that said protruding portion may engage with said recess to securely hold said wavelength converter in a locked position in relation to said support structure.

13. The lighting device according to claim 1, wherein said support structure further comprises a protruding portion and said wavelength converter further comprises a thermally conductive layer partially surrounding said wavelength converter, said thermally conductive layer being in contact with said support structure when the wavelength converter is connected to said support structure, said thermally conductive layer comprising a recess corresponding to the protruding portion such that said protruding portion may engage with said recess to securely hold said wavelength converter in a locked position in relation to said support structure.

14. The lighting device according to claim 1, further comprising a light redirecting element optically connected to said light exit surface and arranged to releasably hold said wavelength converter between said light redirecting element and said support structure.

15. A lighting system comprising a lighting device as claimed in claim 1 comprising: a detector configured to detect at least one characteristic of said wavelength converter and/or at least one characteristic of the light emitted by said light exit surface of said wavelength converter, and a control unit connected to said detector and to said light source, said control unit being configured to control said light source based on said detected characteristic of said wavelength converter and/or said light emitted by said light exit surface of said wavelength converter.

\* \* \* \* \*